United States Patent [19]

Ohori et al.

[11] Patent Number: 5,413,951
[45] Date of Patent: May 9, 1995

[54] COMPOSITE SEMICONDUCTOR SUBSTRATE AND A FABRICATION PROCESS THEREOF

[75] Inventors: Tatsuya Ohori; Isamu Hanyu; Fumitoshi Sugimoto; Yoshihiro Arimoto, all of Kawasaki, Japan

[73] Assignee: Fujitsu Limited, Kawasaki, Japan

[21] Appl. No.: 19,888

[22] Filed: Feb. 19, 1993

[30] Foreign Application Priority Data

Feb. 19, 1992 [JP] Japan .................................. 4-032016

[51] Int. Cl.⁶ ........................................... H01L 21/302
[52] U.S. Cl. ........................................... 437/61; 437/21; 437/62; 437/84; 437/974; 148/DIG. 135
[58] Field of Search .................... 437/61, 62, 21, 84, 437/974; 148/DIG. 12, DIG. 150, DIG. 135

[56] References Cited

U.S. PATENT DOCUMENTS

| | | | |
|---|---|---|---|
| 4,771,016 | 9/1988 | Bajor et al. | 427/21 |
| 4,834,809 | 5/1989 | Kakihara | 437/62 |
| 5,028,558 | 7/1991 | Haisma et al. | 148/DIG. 12 |
| 5,034,343 | 7/1991 | Rouse et al. | 148/DIG. 135 |
| 5,071,792 | 12/1991 | Van Vonno et al. | 437/974 |
| 5,141,148 | 8/1992 | Ichiyawa | 437/21 |
| 5,147,808 | 9/1992 | Pronko | 437/61 |
| 5,229,305 | 7/1993 | Baker | 148/DIG. 135 |
| 5,231,045 | 7/1993 | Miura et al. | 437/21 |

FOREIGN PATENT DOCUMENTS

2-94415  4/1990  Japan .

*Primary Examiner*—Brian Hearn
*Assistant Examiner*—Kevin M. Picardat
*Attorney, Agent, or Firm*—Staas & Halsey

[57] ABSTRACT

A method for fabricating an SOI structure which includes the steps of contacting a single crystal layer of a group III-V compound semiconductor material to a single crystal substrate of sapphire such that a principal surface of said single crystal layer establishes an intimate contact with a corresponding principal surface of said single crystal substrate and bonding the single crystal layer and the single crystal substrate with each other while elevating a temperature.

19 Claims, 12 Drawing Sheets

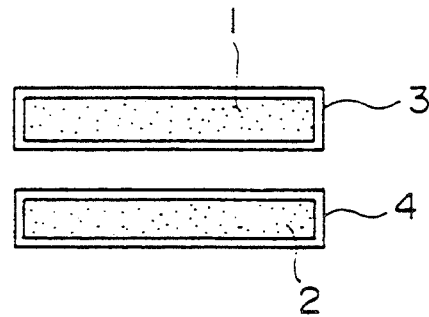
FIG. I(A)
PRIOR ART
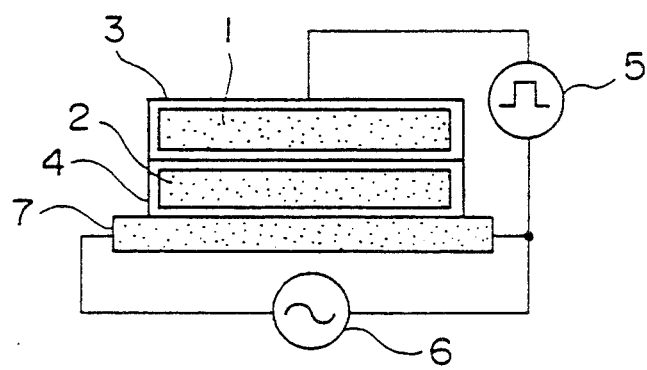
FIG. I(B)
PRIOR ART
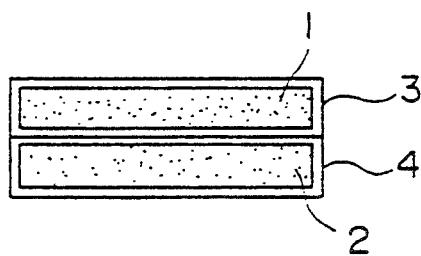
FIG. I(C)
PRIOR ART
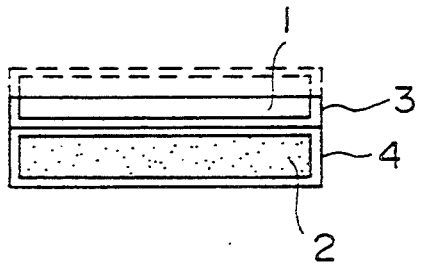
FIG. I(D)
PRIOR ART

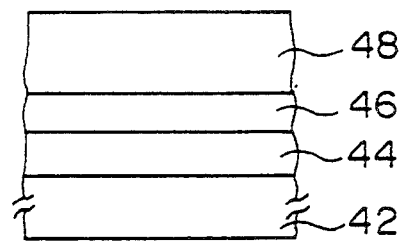
F I G. 10(A)
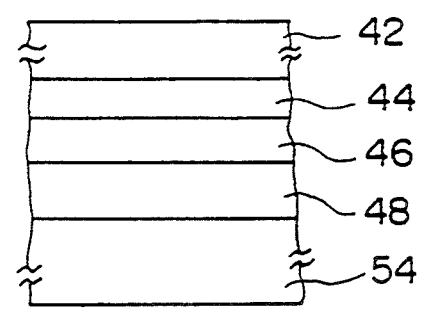
F I G. 10(B)
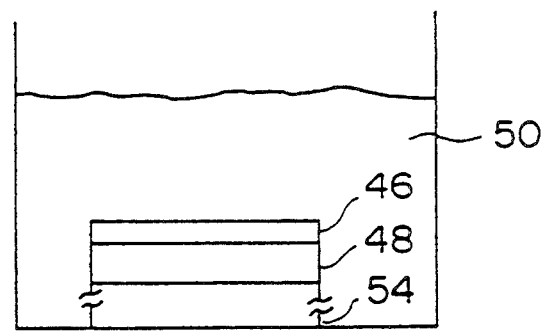
F I G. 10(C)
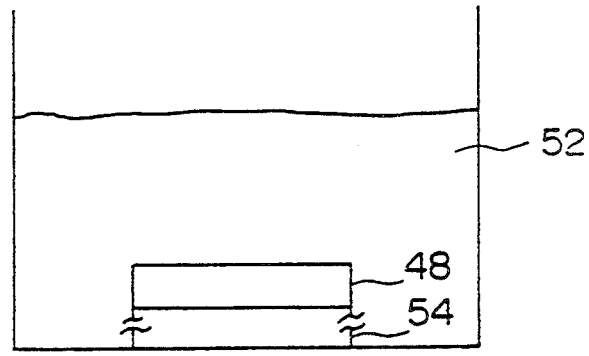
F I G. 10(D)

F I G. 13(A)
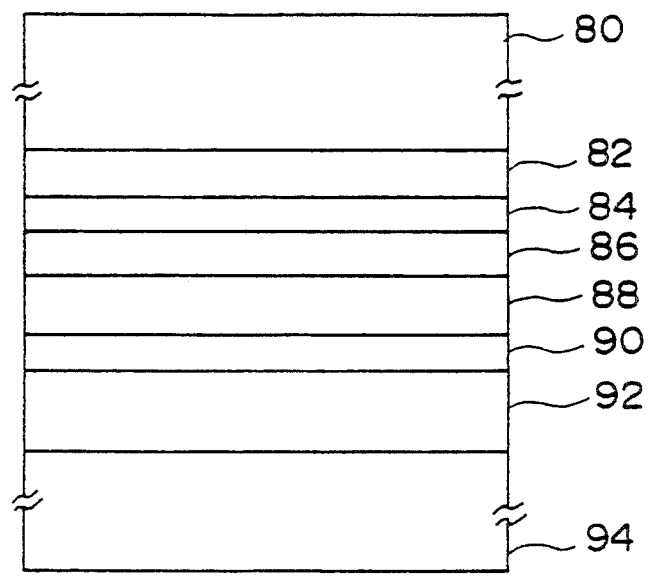
F I G. 13(B)
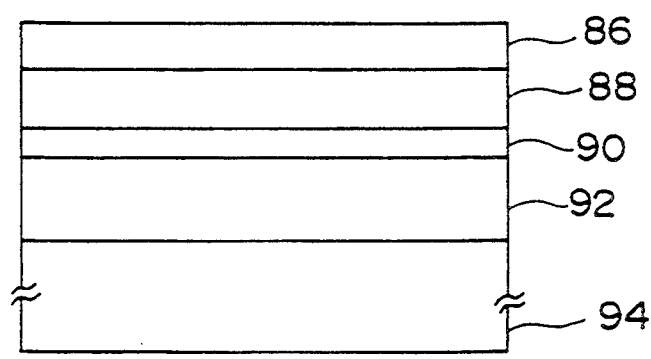

COMPOSITE SEMICONDUCTOR SUBSTRATE AND A FABRICATION PROCESS THEREOF

BACKGROUND OF THE INVENTION

1. Field of the Invention

The present invention generally relates to semiconductor devices, and more particularly, to a composite semiconductor substrate that includes a single crystal substrate of an insulating material and a single crystal layer of a compound semiconductor material that is provided thereon.

2. Description of the Related Art

Compound semiconductor devices are studied intensively in relation to super-fast semiconductor devices. By constructing semiconductor devices on a compound semiconductor layer, one can enjoy the excellent electronic properties pertinent to the compound semiconductor material, such as large electron mobility, formation of a two-dimensional electron gas at the heterojunction interface formed between different semiconductor layers, interaction with optical radiation by causing a direct transition of electrons and holes, and the like. Thus, various semiconductor devices such as HEMT or MESFET are fabricated on a GaAs substrate, a typical group III–V compound semiconductor material, or a mixed crystal thereof.

In order to maximize the operational speed of these semiconductor devices, efforts are made to reduce the size of the device, in addition to the effort in search of an optimum composition of the semiconductor material that is used for the semiconductor device. Currently, semiconductor patterns having a size of less than 0.5 μm can be formed with reliability by using the electron beam exposure process.

On the other hand, such a miniaturization, when undertaken excessively, tends to invite various unwanted problems, such as a short channeling effect, soft error, side gate effect, and the like, wherein the short channeling effect occurs when carriers are urged away from the channel region of a semiconductor device toward the interior of a semiconductor layer on which the device is formed because of a large electric field that is established vertically to the surface of the semiconductor layer. It should be noted that such a large electric field is induced because of the excessively reduced size of the semiconductor device.

The soft error, on the other hand, occurs because of the incidence of high energy particles, such as a particles that cause an excitation of electrons and holes in the semiconductor layer on which the semiconductor device is formed. The carriers thus excited tend to diffuse into a device region at the surface of the semiconductor layer and affect the operation of the device. The problem of soft error is particularly serious in memories having large integration densities or devices that are used in a radioactive environment such as a satellite.

The side gate effect is a phenomenon that is pertinent to compound semiconductor devices, wherein the threshold level of a device such as a FET changes in response to a voltage that is applied to an adjacent device. In this case, it is believed that electron-hole pairs are created due the large electric field associated with the channel region of the device, and recapturing of the excited electrons and holes in the vicinity of the channel region is responsible for the undesirable variation of the threshold level.

In order to avoid the aforementioned various problems, use of the so-called SOI (semiconductor-on-insulator) structure has been studied. In the silicon devices, it has been practiced to bond a silicon single crystal substrate on a silicon oxide layer to form the desired SOI structure.

FIGS. 1(A)–1(D) show the conventional process employed in the silicon devices for forming the SOI structure.

Referring to the drawings, two silicon substrates 1 and 2 are oxidized separately in a step of FIG. 1(A) to form silicon oxide films 3 and 4 respectively on the silicon substrates 1 and 2. Next, the two silicon substrates 1 and 2 thus covered with the silicon oxide films 3 and 4 are contacted with each other intimately and placed on a heating fixture 7 that may be formed of SiC. See FIG. 1(B). There, while energizing the heating fixture 7, a voltage impulse 5 is applied across the two substrates 1 and 2, and the electric field induced in association with the voltage impulse 5 exerts a force between the two contacting substrates such that the substrates 1 and 2 establish a firm mechanical contact. Thereby, the dangling bonds at the surface of the silicon oxide films 3 and 4 establish a stable bond with each other and a structure shown in FIG. 1(C) is obtained. After annealing in an inert atmosphere, the interface between the silicon oxide films 3 and 4 substantially disappears. Next, one of the silicon substrates, for example the substrate 1, is subjected to a mechanical lapping and polishing process to expose the silicon surface, and the polishing process is continued until the thickness of the substrate 1 reaches a predetermined or desired level.

In the case of compound semiconductor devices, however, the foregoing procedure for a silicon substrate is not applicable. It should be noted that formation of a stable oxide film to cover the compound semiconductor substrate such as GaAs is generally not possible.

So far, various studies have been made to achieve an SOI structure for compound semiconductor substrates. For example, Lehmann et al. (Lehmann, V., Mitani, K., Stengel, R., Mii, T., Goesele, U., Jpn. J. Appl. Phys. vol. 28, 1989, L2141–L2143) describes an attempt for bonding InP and GaAs substrates on a silicon substrate. As reported therein, it has been observed that the substrate experiences cracking or separation when the temperature for bonding has risen above 160° C. Obviously, this unsatisfactory result arises due to the mismatching in the thermal expansion coefficient between both substrates. The bonding was possible only in the temperature range below 140° C., while it is obvious that such a low temperature is insufficient for causing bonding in the atomic scale.

Another approach to achieve an SOI structure in the compound semiconductor material would be to grow a compound semiconductor layer on a single crystal substrate of an insulating material. In fact, there have been an extensive study for growing a GaAs layer epitaxially on an insulating single crystal substrate such as sapphire. See Kasai et al., for example (Kasai, K., Kasai, K., Ozeki, M., J. Appl. Phys. vol. 60, 1986, pp. 1–5). Sapphire is selected because it has a thermal expansion coefficient that is close to the thermal expansion coefficient of GaAs in the temperature range above 300° C. See FIG. 2 showing the temperature dependence of the thermal expansion coefficients for various materials.

However, such a growth of the compound semiconductor layer has turned out to be unsuccessful for the fabrication of compound semiconductor devices. More specifically, it turned out that the epitaxial growth of the GaAs layer is possible only on the C-surface of the sapphire crystal shown in FIG. 3, while a generally available large diameter substrate of sapphire shows the R-surface as the principal surface. Further, the GaAs epitaxial layer thus grown on the C-surface inevitably shows the (111) oriented principal surface. As the (111) surface of GaAs does not provide an adequate, defect-free surface contrary to the usual (100) surface that is used extensively for constructing high speed devices such as HEMTs, and in view of the fact that there still exists a lattice mismatch as large as 19%, the possibility of constructing high performance semiconductor devices on the GaAs layer grown epitaxially on a sapphire substrate is no longer studied intensively among persons skilled in the art.

Further, the inventor of the present 10 invention has conducted research to bond a GaAs substrate on a silicon substrate that carries a silicon oxide film thereon. In the experiment, it was confirmed that the bonding between the substrates occurs successfully at a temperature of 700° C., while it was also confirmed that the substrate starts to crack when the temperature has been reduced below about 300° C. The foregoing observation confirms the recognition in the art regarding GaAs-on-Si, that an extensive formation of dislocation occurs when the GaAs epitaxial layer grown on a silicon substrate is cooled below a temperature of about 300° C.

From the foregoing experimental evidence, one has to become pessimistic about the possibility of forming an SOI structure by growing a GaAs single crystal layer on a silicon substrate that carries thereon a silicon oxide film.

SUMMARY OF THE INVENTION

Accordingly, it is a general object of the present invention to provide a novel and useful process for fabricating an SOI structure that includes a single crystal layer of a compound semiconductor material formed on a single crystal substrate of an insulating material.

Another object of the present invention is to provide an SOI structure that includes a single crystal layer of a compound semiconductor material formed on a single crystal substrate of an insulating material.

Another object of the present invention is to provide a process for fabricating an SOI structure that includes a single crystal layer of a compound semiconductor material formed on a single crystal substrate of an insulating material, comprising the steps of: contacting a single crystal layer of a compound semiconductor material to a single crystal substrate of an insulating material such that a principal surface of said single crystal layer establishes an intimate contact with a principal surface of said single crystal substrate; and bonding said single crystal layer and said single crystal substrate with each other at said principal surfaces, said step of bonding comprising a step of elevating a temperature of said single crystal layer and said single crystal substrate such that a rearrangement of atoms occur in said single crystal layer and in said single crystal substrate at least in correspondence to said principal surfaces.

According to the present invention, one can obtain a structure in which a single crystal layer of compound semiconductor material suitable for a semiconductor device or integrated circuit is formed on an insulating support substrate. Thereby, one can construct semiconductor devices that are immune to various disadvantageous effects, such as side gate effect, soft error, short channel effect, and the like.

Other objects and further features of the present invention will become apparent from the following detailed description when read in conjunction with the attached drawings.

BRIEF DESCRIPTION OF THE DRAWINGS

FIGS. 1(A)–1(D) are diagrams showing a conventional fabrication process of an SOI substrate that employs silicon substrates carrying thereon an oxide film;

FIGS. 10(A)–10(D) are diagrams showing the fabrication process of an SOI substrate according to a fourth embodiment of the present invention;

FIGS. 13(A) and 13(B) are diagrams showing the fabrication process of an SOI substrate according to a seventh embodiment of the present invention.

DETAILED DESCRIPTION OF PREFERRED EMBODIMENTS

FIGS. 4(A)–4(D) show the fabrication process of an SOI substrate according to a first embodiment of the present invention.

Figure 4A:
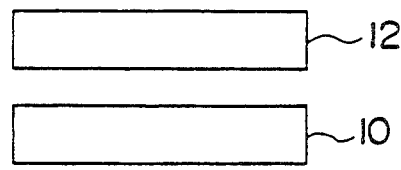
FIGS. 4(A)–4(D) are diagrams showing the fabrication process of an SOI substrate according to a first embodiment of the present invention and FIGS. 4(E) is a TEM photograph of the cross-section of the composite SOI substrate fabricated in accordance with the foregoing process of FIGS. 4(A)–4(C) and particularly of the interface region in which the respective, principle surfaces of the $Al_2O_3$ sapphire substrate and the GaAs substrate are bonded together.
Figure 4B:
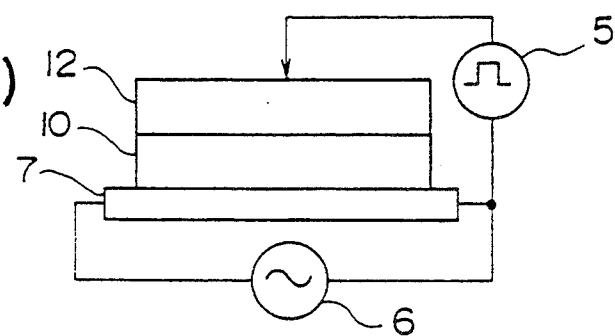

Referring to FIG. 4(A), a commercially available single crystal substrate 10 of $Al_2O_3$ (sapphire substrate available from Kyocera) is placed on a susceptor 7 as shown in FIG. 4(B) and incorporated into an evacuated chamber (not shown) together with a GaAs single crystal substrate 12 that is placed on the principal surface of the sapphire substrate. The purchased sapphire substrate 10 has a diameter of about 3 inches and a thickness of about 300 μm and has the R-surface as the principal surface with a total thickness variation of 2 μm–5 μm, while the GaAs substrate 12 is purchased from Sumitomo Electric and has a diameter of about 3 inches and a thickness of about 650 μm. The GaAs substrate 12 shows the (100) surface as the principal surface, with the total thickness variation of 2 μm.

There, the sapphire substrate 10 and GaAs substrate 12 are cleaned in a phosphoric acid for removal of contaminants, and are contacted with each other at the respective principal surfaces and placed on the susceptor 7 that includes therein a carbon heating element, as shown in FIG. 4(B). Further, an electrode, not illustrated, is attached to an upper principal surface of the GaAs substrate 12. Next, the carbon heating element is energized by an A.C. power source 6 such that the temperature of the substrates 10 and 12 increases to about 500°–700° C., preferably to about 650° C. Further, nitrogen is introduced into the evacuated chamber for enhancement of intimate contact between the substrates 10 and 12 at respective, mutually contacting principal surfaces, and a voltage pulse 5 is applied for exerting an electrically induced force across the two substrates 10 and 12. Typically, a D.C. voltage pulse having a magnitude of ±200 volts is applied for about 1 minute. Thereby, the substrates 10 and 12 are urged to contact with each other intimately, and a firm contact is established between both substrates, as shown in FIG. 4(C).

Figure 4C:
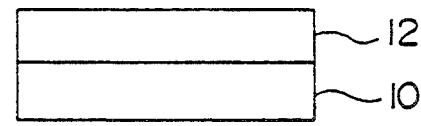
Figure 4D:
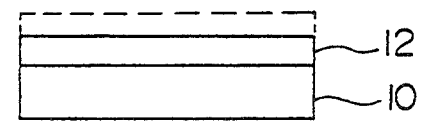

Next, the structure obtained in the step of FIG. 4(C) is subjected to a polishing process in a step of FIG. 4(D) for reducing the thickness of the substrate 12 by mechanical means, until the GaAs layer 12 has a predetermined thickness. After the mechanical polishing process, the surface of the layer 12 is subjected to etching for reducing the thickness thereof further.

Figure 5A:
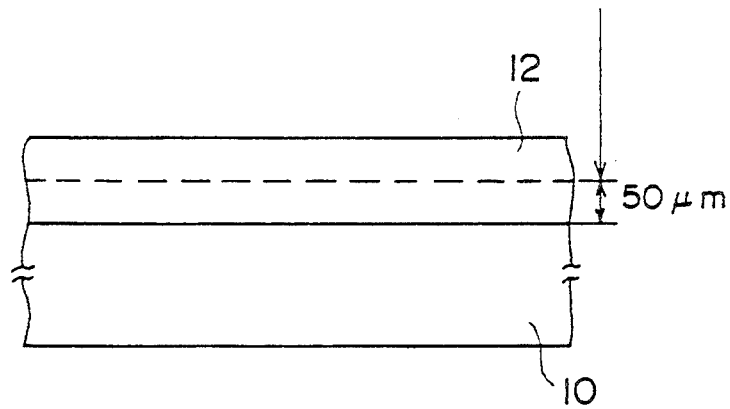
FIGS. 5(A)–5(C) are diagrams showing a process carried out in correspondence to the step of FIG. 4(D) for reducing the thickness of a compound semiconductor layer forming a part of the SOI substrate.
Figure 5B:
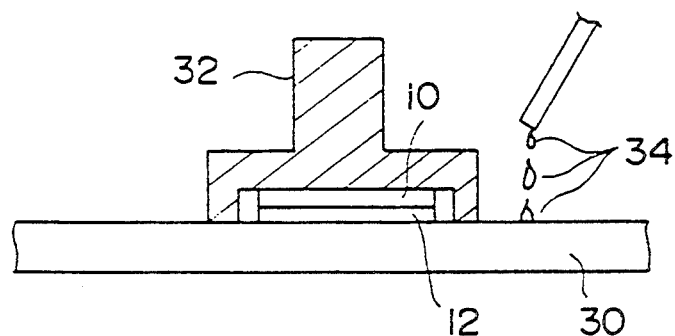
Figure 5C:
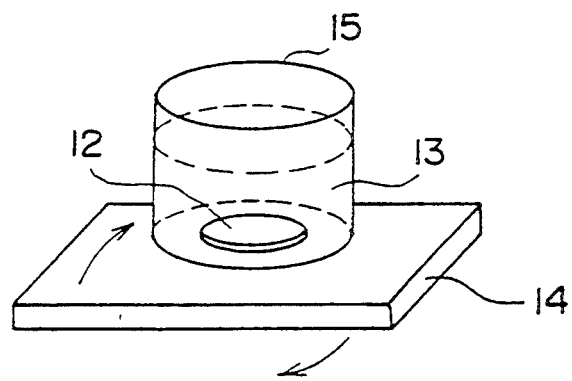

FIGS. 5(A)–5(C) show the process that is conducted after the step of FIG. 4(D), for reducing the thickness of the GaAs layer 12.

Referring to FIG. 5(A) first, the GaAs layer 12 is polished mechanically to a thickness of about 50 μm. The polishing is achieved by contacting the exposed principal surface of the layer 12 (upper major surface in FIG. 5(A)) to the surface of a revolving lapping wheel 30 as shown in FIG. 5(B) while urging the composite SOI substrate obtained in the step of FIG. 4(C) against the surface of the wheel 30 by means of a jig 32 with a predetermined urging force. The surface of the wheel 30 is covered by an abrasive cloth and the exposed principal surface of the layer 12 is lapped as a result of the abrasive action of the abrasive cloth. During the lapping process, a liquid containing abrasives is dropped on the abrasive cloth periodically.

Next, as shown in FIG. 5(C), the composite SOI substrate thus lapped mechanically as shown in FIG. 5(A) is placed in a container 15 that contains therein an etching solution 13 as shown in FIG. 5(C). There, it will be seen that the container 15 is filled by the etching solution 13 and the composite substrate is placed at the bottom of the container, with the principal surface of the GaAs layer 12 facing in the upward direction. Further, the container 15 is placed on a revolving base 14. Typically, a mixture of $NH_4OH$, $H_2O_2$ and $H_2O$ is used with a volumetric ratio of 1:1:1. By processing the surface of the GaAs layer 12 for about 20 minutes, one can reduce the thickness of the layer 12 to about 1.8 μm, which is suitable for forming an active device thereon.

It should be noted that the foregoing temperature range of 500°–700° C. is selected based upon the matching of the thermal expansion coefficient between the GaAs layer 12 and the underlying sapphire substrate 10. See the diagram of FIG. 2 that shows an excellent matching of the thermal expansion coefficient between both crystals, particularly in the temperature range between 300° C.–700° C. Generally, the matching of the thermal expansion coefficient between GaAs and sapphire is satisfactory in the temperature range between −100° C.–700° C., although the temperature below 500° C. is not effective for establishing a firm bond between the sapphire substrate 10 and the GaAs substrate 12. After cooling to the room temperature environment, no cracking or separation of the semiconductor layers has been observed.

Figure 4E:
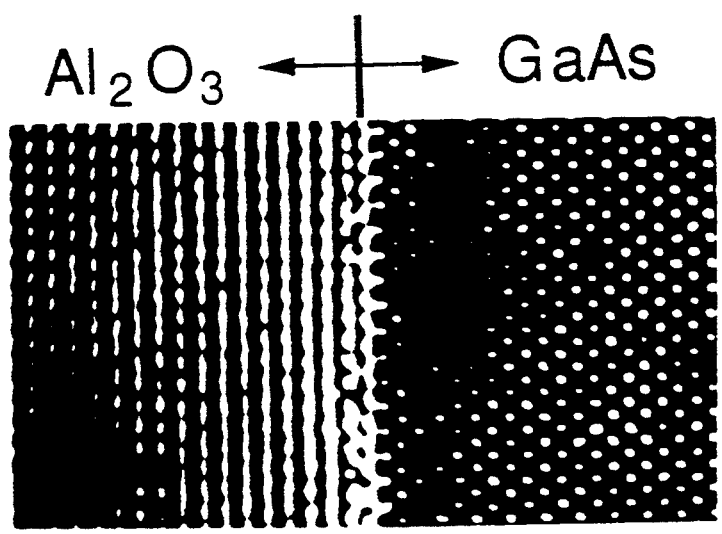

FIG. 4(E) is a TEM photograph of the cross section of the composite SOI substrate thus fabricated in correspondence to the part that includes the interface region, wherein the principal surfaces of the sapphire substrate 10 and the GaAs substrate 12 are bonded with each other according to the foregoing process of FIG. 4(C). The magnification scale of the TEM photograph is $8 \times 10^6$, and the white dots represent the atoms forming the crystal of $Al_2O_3$ and GaAs. It should be noted that the TEM photograph was obtained by irradiating an accelerated electron beam into the (110) surface of GaAs.

As can be seen clearly from the TEM photograph of FIG. 4(E), the crystal structure of GaAs is retained substantially unchanged in the side of the GaAs layer 12, while there is formed a transient layer, characterized by four or at best five atomic layers, in the sapphire substrate 10, wherein the crystal structure of $Al_2O_3$ is modified in correspondence to the transient layer. The result of the TEM observation clearly indicates that the GaAs layer 12 and the sapphire substrate 10 processed according to the step of FIG. 4(B) are indeed bonded in the atomic scale, and that the modification of the crystal structure occurs only in the sapphire substrate 10 rather than in the GaAs layer 12.

Figure 6:
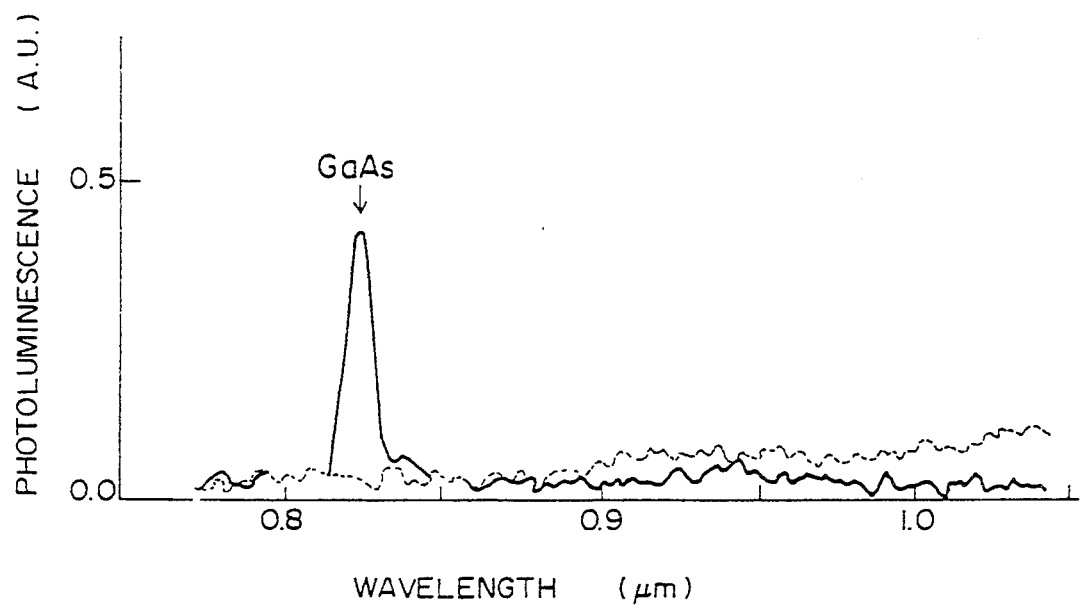
FIG. 6 is a diagram showing the photoluminescence obtained with respect to the compound semiconductor layer that is formed according to the first embodiment of the present invention.

FIG. 6 is a photoluminescence spectra of the GaAs layer thus obtained. In the experiment, a laser beam is irradiated from the side of the sapphire substrate 10, wherein the continuous line represents the result for the composite SOI substrate obtained by the present invention. On the other hand, the broken line represents the result for a GaAs layer grown epitaxially on a sapphire substrate by an MOCVD process with the (111) principal surface.

As can be seen clearly, there exists a sharp peak of photoluminescence in correspondence to the band edge of GaAs in the SOI substrate of the present invention, indicating the excitation and recombination of carriers between the conduction band and the valence band without being captured by impurities or defects. On the other hand, when the GaAs layer is grown on the sapphire substrate, no such band edge photoluminescence peak was observed. Obviously, the GaAs layer thus grown involves therein a very large number of defects that trap the excited carriers.

The result of FIG. 6 and the the TEM photograph of FIG. 4(E) indicates that the GaAs layer 12 thus provided on the sapphire substrate 10 possesses the crystallinity that is substantially comparable to the bulk GaAs crystal that is used for semiconductor substrates. In other words, one can reduce the dislocation density in the GaAs layer 12 to the order of about $10^5$–$10^6 cm^{-2}$ or less in the SOI substrate by the present invention. In addition, the evaluation of the X-ray diffraction pattern shows the half-height width of about 16 seconds for the GaAs layer thus formed on the sapphire substrate, wherein it should be noted that the foregoing result is comparable to the normal half-height width of about 13 seconds for the bulk GaAs crystal for semiconductor use. Further, it was confirmed that the GaAs layer 12 shows an electron mobility of 5000 $cm^2/V\cdot cm$ at room temperature. Thus, the SOI substrate of the present invention provides the solution to the various problems of fabricating compound semiconductor devices based upon the SOI structure.

Figure 2:
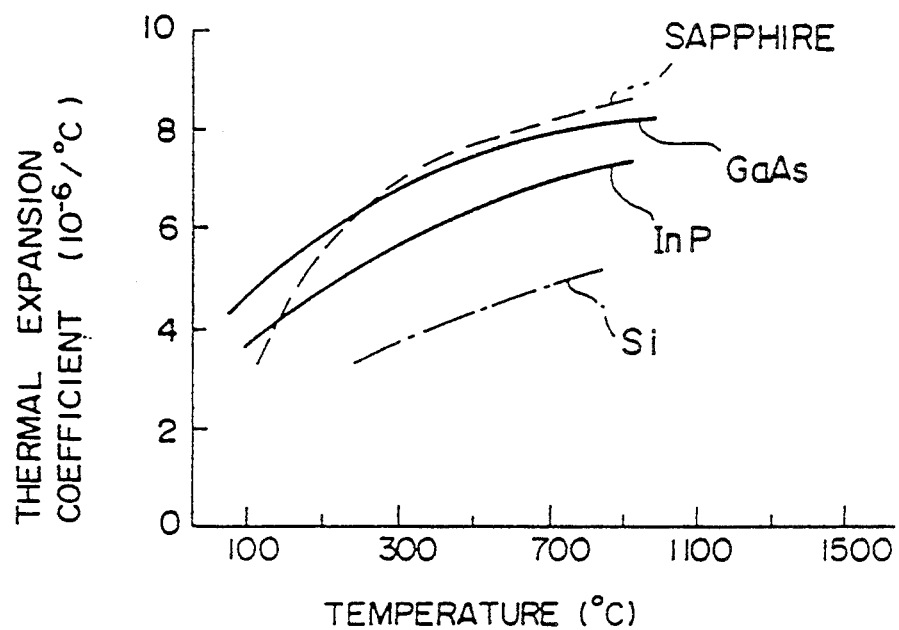
FIG. 2 is a diagram showing the thermal expansion coefficient of sapphire in comparison with various semiconductor materials.
Figure 3:
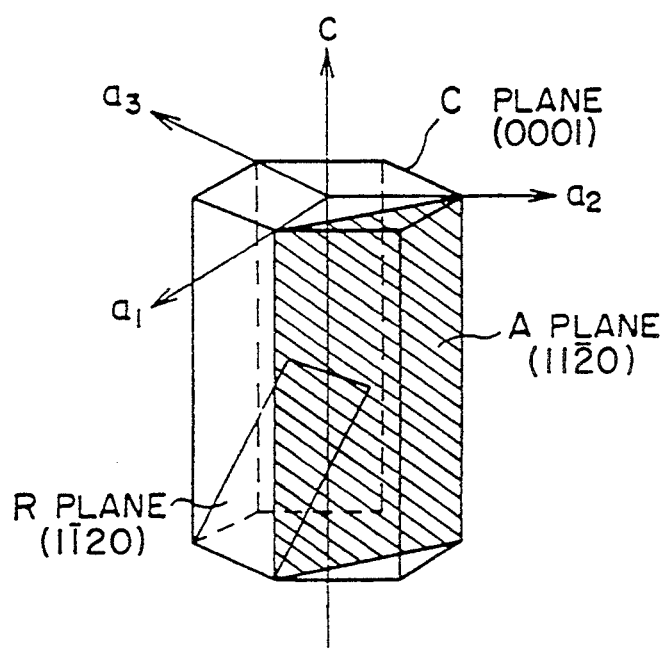
FIG. 3 is a diagram showing the orientation of various crystal surfaces in the sapphire crystal structure.

In view of excellent matching of the thermal expansion coefficient between GaAs and sapphire shown in FIG. 2, the temperature used in the step of FIG. 4(B) for bonding the GaAs substrate 12 on the sapphire substrate 10 may be increased up to about 1100° C., provided that evaporation of As is compensated for by supplying As vapor with a partial pressure generally equal to the equilibrium pressure of As vapor with respect to the GaAs crystal. For example, one may supply As during the bonding step of FIG. 4(B) with a partial pressure of about $5 \times 10^{-7}$ Pa at 1100° C. When the pressure is increased as such, a more uniform and reliable bonding between the GaAs substrate 12 and the sapphire substrate 10 is obtained.

In addition to the experiment described previously for bonding the sapphire substrate having a thickness of 300 μm to the GaAs substrate having a thickness of 650 μm, similar experiments have been conducted while changing the thickness of the sapphire substrate and the GaAs substrate. Thereby, it was found that the area of intimate bonding changes with the relative thicknesses of both substrates. More specifically, 85-95% of the surface area have been successfully bonded by setting the thickness of the sapphire substrate to about 600 μm and the thickness of the GaAs substrate to about 200 μm. When the thicknesses of both substrates are set to about 600 μm, on the other hand, the area that has been bonded was only 50-80%. Thus, it may be concluded that the optimum condition for the bonding is achieved by setting the thickness of the GaAs substrate to be smaller than about ⅓ of the sapphire substrate when the bonding is achieved.

In addition, it was discovered that the success of bonding depends heavily upon the total thickness variation of both substrates. When the total thickness variation exceeds about 5 μm, the area of successful bonding is limited to only 50-60%. In order to achieve the desired bonding, it is necessary to finish the surface of both the sapphire substrate and the GaAs substrate such that the total thickness variation becomes smaller than about 2 μm. Further, it should be noted that the foregoing bonding of the GaAs substrate and the sapphire substrate is achieved not only for the GaAs substrate that has the exact (100)-oriented surface but may be applied to the substrate that is offset from the (100) surface within about 10 degrees.

Further, it should be noted that the fabrication process of the SOI structure of the present embodiment is also applicable to the SOI substrate wherein an InP substrate is bonded to the sapphire substrate with the (100) orientation for the InP principal surface. Hereinafter, a second embodiment of the present invention will be described with reference to FIG. 7, wherein a GaAs layer and an InP layer are bonded on a common principal surface of a sapphire substrate.

Figure 7:
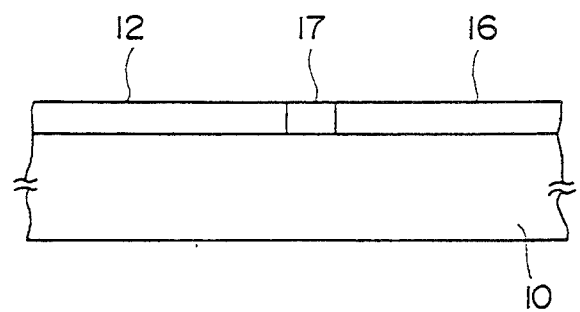
FIG. 7 is a diagram showing an SOI substrate according to a second embodiment of the present invention in a cross sectional view.

Referring to FIG. 7, it will be noted that the sapphire substrate 10 carries on the principal surface thereof the GaAs layer 12 described previously and an InP layer 16, wherein the InP layer 16 is bonded to the sapphire substrate 10 simultaneously as the GaAs layer 12 in accordance with the process shown in FIG. 4(B). After the bonding, the etching process shown in FIG. 5(C) is achieved for the GaAs layer 12, and then the InP layer 16 is processed by an HCl etchant to reduce the thickness thereof to a predetermined thickness level. It should be noted that the foregoing mixture of $NH_4OH$, $H_2O_2$ and $H_2O$ acts selectively upon GaAs, while HCl acts selectively upon InP. After the layers 12 and 16 are processed to have respective, predetermined thicknesses, the gap formed between the layers 12 and 16 is filled by an insulating material 17. The substrate shown in FIG. 7 is suitable for forming an opto-electronic device wherein an FET is formed on the GaAs layer 12 and a laser diode on the Inp layer 16.

Next, a third embodiment of the present invention for providing a layered body suitable for constructing a HEMT will be described with reference to FIGS. 8(A)–8(C).

Figure 8A:
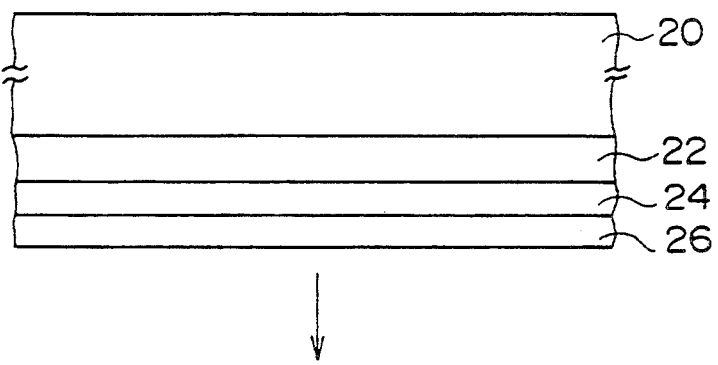
FIGS. 8(A)–8(C) are diagrams showing the fabrication process of an SOI substrate according to a third embodiment of the present invention.
Figure 8B:
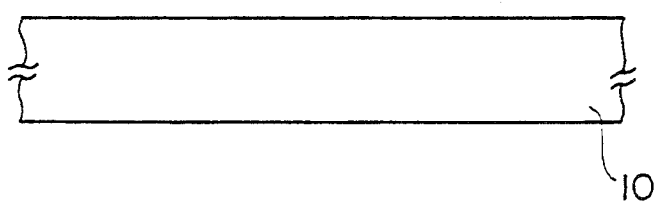
Figure 8C:
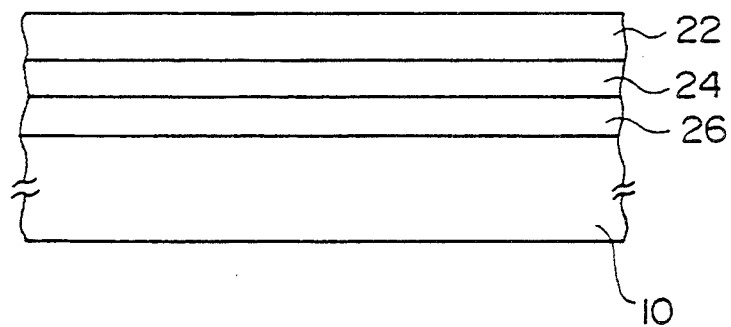

Referring to FIG. 8(A), an n-type GaAs layer 22, an n-type AlGaAs layer 24 and an undoped GaAs layer 26 are grown consecutively and epitaxially on a single crystal GaAs substrate 20. Typically, the epitaxial layers 22–26 are grown by the MOCVD process, wherein the GaAs layer 22 is grown with a thickness of about 50 nm, and Si is incorporated therein as a dopant with a concentration level of about $2 \times 10^{18} cm^{-3}$. The AlGaAs layer 24, in turn, is grown with a thickness of about 30 nm, and contains Si with a concentration level also of about $2 \times 10^{18} cm^{-3}$. The undoped GaAs layer 26 has a thickness of about 1 μm.

Next, the layered body thus formed is turned over as indicated in FIG. 8(A) and is bonded upon the upper major surface of the sapphire substrate 10. Similarly to the previous embodiments, the bonding is achieved according to the process of FIG. 4(B).

After the step of FIG. 4(B), the GaAs substrate 20 is removed by mechanical lapping followed by an etching process. Thereby, a structure shown in FIG. 8(C) that is suitable for constructing a HEMT is obtained. It will be noted that the undoped GaAs layer 26 acts as the active layer while the n-type AlGaAs layer 24 acts as the electron supplying layer for establishing a two-dimensional electron gas at the interface between the layers 24 and 26, as is well known in the art. It should be noted that, in the foregoing process, one may use InP and/or other III–V or II–IV compound semiconductor materials for the substrate 20 as well as for the epitaxial layers 22–26.

Figure 9A:
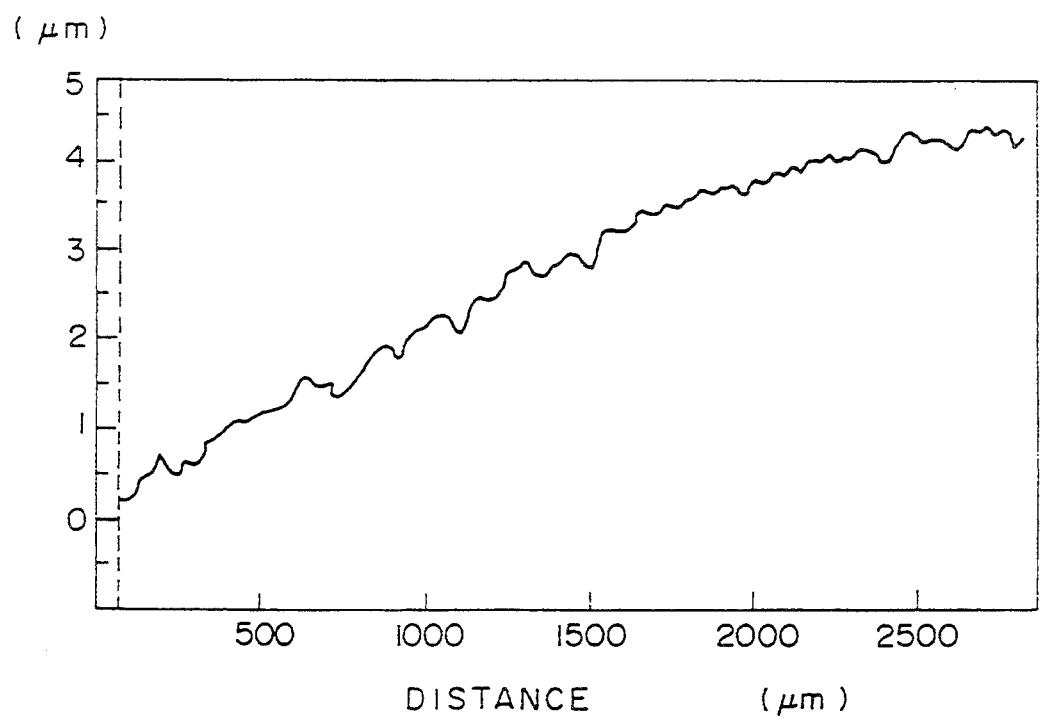
FIGS. 9(A) and 9(B) are diagrams showing the thickness distribution of the compound semiconductor layer in the SOI substrate obtained according to the first embodiment of the present invention.
Figure 9B:
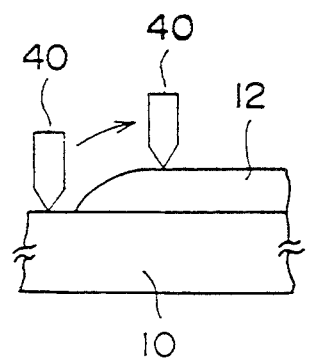

Next, a fourth embodiment of the present invention will be described with reference to FIGS. 9(A) and 9(B) as well as with reference to FIGS. 10(A)–10(E), wherein FIG. 9(A) shows the result of the thickness distribution of the GaAs layer 12 formed on the sapphire substrate 10 according to the process of the first embodiment, and FIG.9(B) shows the process of such a measurement.

It should be noted that the first embodiment of the present invention employs mechanical lapping and mirror polishing for reducing the thickness of the GaAs layer 12 that is bonded upon the sapphire substrate 10. On the other hand, the art of mirror finishing a semiconductor substrate is a process that requires expertise and is treated generally as a proprietary process of the vendor of the semiconductor substrate. Such a process is not readily available by the manufacturer of semiconductor devices. As shown in FIG. 9(A) that is obtained by the applicant of the present invention, it can be seen that the thickness of the GaAs layer 12 changes gradually with increasing distance from the edge part thereof. There, a thickness variation in the magnitude of about 5 μm was observed in the distance range of about 2500 μm. Obviously, such a thickness variation of the GaAs layer 12 invites difficulty in fabricating semiconductor devices thereon. It should be noted that the result of FIG. 9(A) is obtained by the DEKTAK 5000 step detector of TECCOR LTD.

In the fourth embodiment of the present invention, an etching stopper layer is included in the epitaxial structure that is bonded upon the sapphire substrate.

Referring to FIG. 10(A) showing the epitaxial structure, a GaAs layer 44 is grown epitaxially on a GaAs substrate 42 by an MOCVD process with a thickness of about 50 nm. Typically, the GaAs substrate 42 has a diameter of 3 inches and a thickness of about 653 μm. On the GaAs layer 44, an InGaP etching stopper layer 46 is grown epitaxially with a thickness of about 50 nm also by an MOCVD process, and a GaAs layer 48 is grown further on the InGaP layer 46 epitaxially by an MOCVD process with a thickness of about 1 μm. There, the GaAs layer 44 acts as a buffer layer for improving the quality of crystal of the layers that are grown thereon epitaxially.

Next, in the step of FIG. 10(B), the epitaxial structure is turned over and bonded upon a sapphire substrate 54 such that the exposed upper major surface of the GaAs layer 48 establishes an intimate contact with the exposed R surface of the sapphire substrate 54. Further, by applying the process of FIG. 4(B) with a processing condition described therein, a firm bonding is achieved between the sapphire substrate 54 and the layered body placed thereon.

Next, the composite substrate thus obtained is subjected to a mechanical lapping such that the layer 42 is lapped to reduce the thickness from 635 μm to about 35 μm. It should be noted that the lapping process and the facility used in this stage are readily available without special skill or expertise.

Next, the composite layered body thus processed is dipped into an etching solution 50 in a step of FIG. 10(C) for selective removal of the GaAs layers 42 and 44, wherein a mixture of $NH_4OH$, $H_2O_2$ and $H_2O$ with a volumetric ratio of 1:1:1 is used for the etching solution 50. As the etching solution 50 does not react upon InGaP layer 46, the etching stops spontaneously upon exposure of the surface of the layer 46.

Next, in the step of FIG. 10(D), the composite substrate thus processed and including the layers 46 and 48 on the sapphire substrate 54, is washed in deionized water and dipped subsequently into an etching solution 52 of HCl for about 10 seconds. During this process, the InGaP etching stopper layer 46 is removed, and the GaAs layer 48 is exposed. As HCl reacts selectively upon InGaP, the etching stops spontaneously upon exposure of the GaAs layer 48.

According to the process of the present embodiment, one can form the GaAs layer 48 to have an exposed principal surface of which flatness is comparable to that of ordinary epitaxial layers, particularly when the thickness of the InGaP layer 46 is set very small, in the order of 50 nm or less. Thereby, the interval in which the GaAs layer 48 is exposed to the etching solution 50 is minimized even when the etching proceeds non-uniformly, and the problem of degradation of surface morphology of the layer 48 due to the contact with the HCl etching solution 50 is minimized.

Thus, the composite SOI substrate that includes the GaAs layer 48 therein has the quality that is suitable for constructing a high-performance semiconductor device thereon. Further, it was found that the InGaP/GaAs selective doping structure that is formed by growing an InGaP layer on the GaAs layer 48 shows the electronic property that is comparable to the corresponding structure grown on the ordinary GaAs epitaxial layer.

Next, a fifth embodiment of the present invention will be described with reference to FIGS. 11(A) and 11(B), wherein the present embodiment describes a process for fabricating a composite SOI substrate that includes therein a selectively doped structure suitable for constructing a HEMT.

Figure 11A:
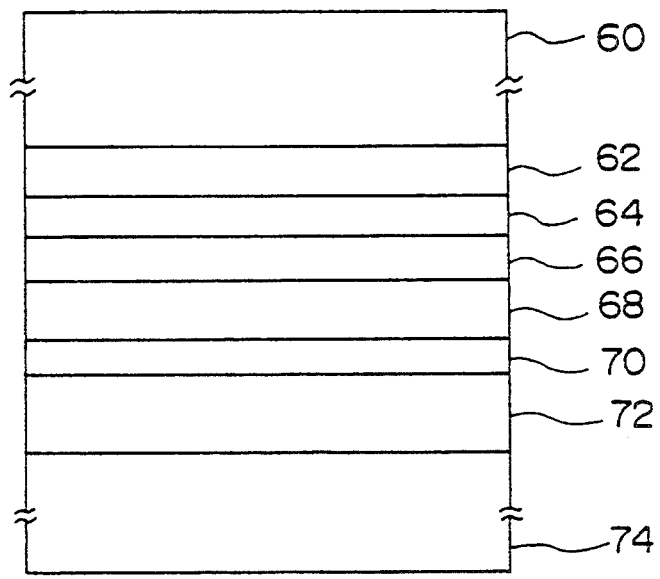
FIGS. 11(A) and 11(B) are diagrams showing the fabrication process of an SOI substrate according to a fifth embodiment of the present invention.

Referring to FIG. 11(A) showing the growth of epitaxial layers on the substrate upside-down, an undoped GaAs substrate 60 having a thickness of about 635 μm is provided, and an undoped GaAs layer 62 is grown thereon by an MOCVD process with a thickness of about 100 nm. Further, an undoped InGaP layer 64 is grown on the GaAs layer 62 by an MOCVD process with a composition of $In_{0.5}Ga_{0.5}P$ and a thickness of about 50 nm. Further, an n-type GaAs layer 66 incorporating therein Si with a concentration level of $2 \times 10^{18} cm^{-3}$ as dopant is grown by an MOCVD process with a thickness of about 50 nm. Further, an n-type GaAlAs layer 68 having a composition of $Al_{0.3}Ga_{0.7}As$ and containing Si with a concentration level of $2 \times 10^{18} cm^{-3}$ is grown on the layer 66 with a thickness of about 30 nm. On the layer 68, an undoped $Al_{0.3}Ga_{0.7}As$ layer 70 is grown with a thickness of about 2 nm, also by an MOCVD process, and an undoped GaAs layer 72 is grown further on the layer 70 by an MOCVD process with a thickness of about 2 μm.

The layered body thus formed is then bonded upon a sapphire substrate 74 such that the upper major surface of the layer 72 (lower major surface in the upside-down representation of FIG. 11(A)) is contacted upon the principal surface of the sapphire substrate 74, according to the process and condition described already with reference to FIG. 4(B), to form a composite substrate.

Next, the composite SOI substrate is processed by a mechanical lapping and wet etching process similarly to the processes of FIGS. 10(C) and 10(D), to remove the GaAs substrate 60, the GaAs buffer layer 62 and the InGaP etching stopper layer 64 consecutively. It should be noted that the GaAs layer 62 corresponds to the GaAs buffer layer 44 while the InGaP layer 64 corresponds to the InGaP etching stopper layer 46. As a result of the foregoing processing, a composite SOI substrate that carries thereon a selective doped structure is obtained as shown in FIG. 11(B).

Next, a sixth embodiment of the present invention will be described with reference to FIGS. 12(A) and 12(B), wherein use of phosphide is eliminated for easiness of fabrication of the epitaxial structure by the MBE process. In other words, only arsenide is used for the epitaxial layers of the present embodiment.

Figure 11B:
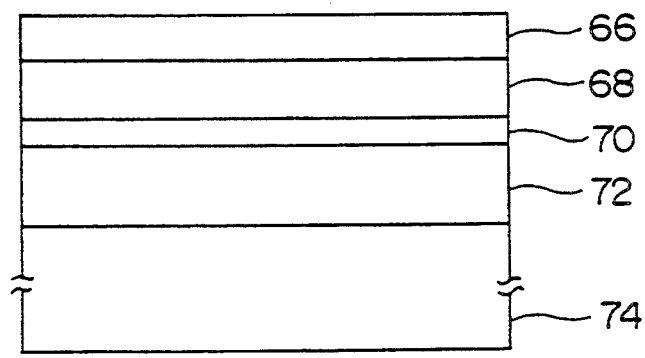
Figure 12A:
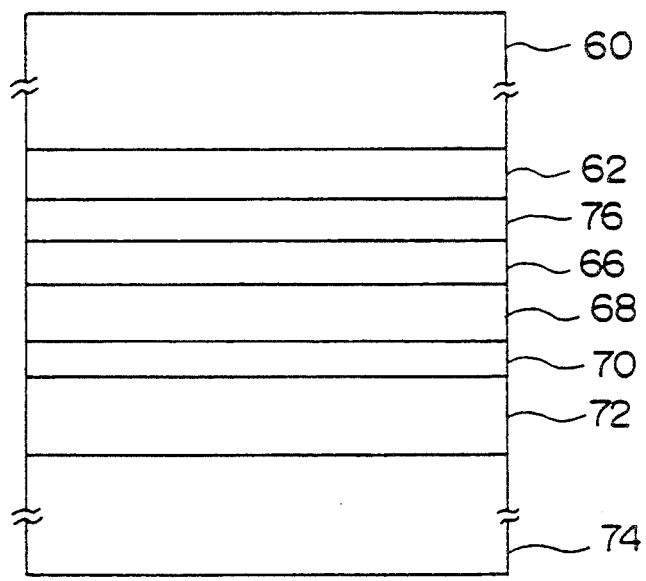
FIGS. 12(A) and 12(B) are diagrams showing the fabrication process of an SOI substrate according to a sixth embodiment of the present invention.
Figure 12B:
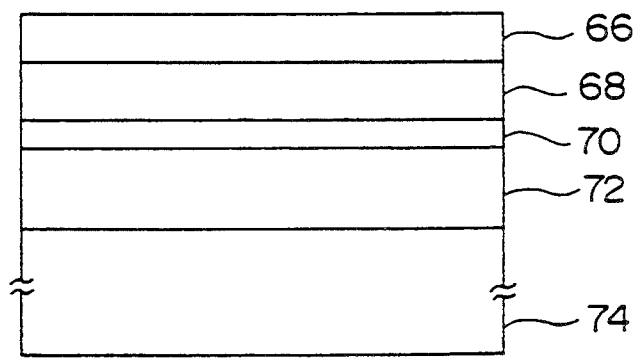

Referring to FIG. 12(A) showing a generally identical structure as FIG. 11(A) together with corresponding reference numerals, the present embodiment is different from the previous embodiment of FIGS. 11(A) and 11(B) only in the point that an etching stopper layer 76 having a composition of $Al_{0.8}Ga_{0.2}As$ is used instead of the InP etching stopper layer 64. Thereby, the epitaxial layers 62–72 can be formed by an MBE process while using As alone for the source of the group V element.

In order to achieve the desired spontaneous stopping of the etching at the etching stopper layer 76, the present embodiment uses an etching solution that is different from the etching solution 50, wherein the etching solution used in the present embodiment is a mixture of citric acid, $H_2O_2$ and $NH_4OH$. More specifically, the etching solution is prepared by dissolving 200 grams of citric acid into 100 cc of deionized water, and adding 10 cc of the citric acid solution thus formed into 200 cc of an $H_2O_2$ solution (diluted to 30% concentration level). Further, about 5 cc of $NH_4OH$ is added to the mixture of the citric acid and $H_2O_2$ thus formed to set the PH of the mixture to about 7.5.

By dipping the layered body of FIG. 12(A) into the etching solution thus formed after lapping the GaAs substrate 60 to the thickness of about 15 $\mu$m, the GaAs layers 60 and 62 are dissolved after about 15 minutes, leaving the exposed, unetched GaAlAs etching stopper layer 76. Further, the GaAlAs layer 76 is removed by a selective etching process using a 10% diluted HF solution, wherein the etching stops spontaneously upon exposure of the n-type GaAs layer 66. The GaAs layer 66 thus exposed shows an excellent surface morphology suitable for constructing an active device thereon. In the present embodiment, the amount of mechanical lapping of the substrate 60 is increased in view of the reduced etching rate of the citric acid etching solution used in the present embodiment. As a result of the foregoing lapping and subsequent etching processes, the structure shown in FIG. 12(B) is obtained, wherein the structure of FIG. 12(B) is substantially identical with the structure of FIG. 11(B).

Next, a seventh embodiment of the present invention will be described with reference to FIGS. 13(A) and 13(B), wherein a layered semiconductor body, constructed on an InP substrate 80, is bonded upon a sapphire substrate 94.

Referring to FIG. 13(A) showing the layered semiconductor body upside-down similarly to FIGS. 11(A) and 12(A), an undoped InGaAs layer 82 having a composition $In_{0.51}Ga_{0.49}As$ is grown epitaxially on the InP substrate 80 with a thickness of about 100 nm. Typically, the InP substrate 80 has a thickness of 500 $\mu$m. Further, an undoped InP layer 84 is grown epitaxially on the InGaAs layer 82 with a thickness of about 50 nm, and an n-type InGaAs layer 86 having a composition of $In_{0.53}Ga_{0.47}As$ and doped by Si with a concentration level of $2\times10^{18}cm^{-3}$, is grown further on the InP layer 84 with a thickness of about 50 nm. On the InGaAs layer 86, an n-type InAlAs layer 88 having a composition of $In_{0.53}Al_{0.47}As$ and doped by Si with a concentration level of $2\times10^{18}cm^{-3}$, is grown epitaxially with a thickness of 25 nm, and an undoped InAlAs layer 90 having a composition $In_{0.53}Al_{0.47}As$ is grown on the n-type InAlAs layer 88 epitaxially with a thickness of about 2 nm. Further, an undoped InGaAs layer 92 having a composition $In_{0.53}Ga_{0.47}As$ is grown epitaxially on the layer 90 with a thickness of about 1 $\mu$m. The undoped InAlAs layered body thus formed is then bonded upon the upper major surface of a sapphire substrate 94 according to the process of FIG. 4(B), such that the exposed upper major surface of the layer 92 (lower major surface in the illustration of FIG. 13(A)) is bonded to the upper major surface of the sapphire substrate 94. Thereby, a composite body shown in FIG. 13(A) is obtained.

Next, the InP substrate is mechanically lapped and etched subsequently similarly to the process of the previous embodiments wherein the InP substrate 80, the InGaAs layer 92 and the InP layer 84 are all removed consecutively as a result of the selective etching, and the composite SOI substrate shown in FIG. 13(B) is obtained.

It should be noted that the present invention includes various modifications. For example, one may use a composite or laminated substrate that includes sapphire or silicon oxide layer carried on an InP substrate or GaAs substrate, in place of the foregoing sapphire substrate. As long as the discrepancy in the lattice constant across the lower insulating substrate and the compound semiconductor layer that is bonded thereto is held within about ±20%, a satisfactory bonding can be achieved.

Further, the selective etching process employed in the present invention is not limited to the wet etching process as described, but one may use a dry etching process that shows selectivity upon etching a GaAlAs layer and a GaAs layer. For example, a dry etching process that uses $CCl_2F_2$ may be employed, together with optical radiation if necessary.

Further, various modifications of the layered structure is possible in the composite substrate shown in FIGS. 11(A)–13(A). For example, one may use an undoped GaAlAs layer in place of the n-type GaAlAs layer 68 in the structure of FIG. 11(B) and dope the GaAs layer 72 to the n-type selectively along the heterojunction interface to the GaAlAs layer 70. Further, one may interpose an InGaAs layer between the layers 70 and 72 to form a pseudomorphic structure. In the structure of FIG. 12(B), on the other hand, one may use other compositions for the etching stopper layer 76 as long as the compositional parameter x representing the composition $Al_xGa_{1-x}As$ of the etching stopper layer 76 is set equal to or larger than 0.5.

Further, the present invention is not limited to the embodiments described heretofore, but various variations and modifications may be made without departing from the scope of the invention.

What is claimed is:

1. A method for fabricating as semiconductor-on-insulator structure that includes a single crystal layer of a group III–V first compound semiconductor material formed on a single crystal substrate of sapphire, said method comprising the steps of:

growing a plurality of epitaxial layers consecutively on a second substrate of a second compound semiconductor material to form a layered structure, wherein said single crystal layer is formed at one end of said layered structure and has an exposed first principal surface, said layered structure comprising an etching stopping layer such that said etching stopping layer has an etching rate different from those of the other ones of said plurality of epitaxial layers;

contacting the single crystal layer to the single crystal substrate of sapphire such that the first principal surface of said single crystal layer establishes an intimate contact with a second principal surface of said single crystal substrate;

bonding said single crystal layer and said single crystal substrate with each other at said mutually contacting first and second principal surfaces by elevating a temperature of said single crystal layer and said single crystal substrate such that a rearrangement of atoms occurs in said single crystal layer and in said single crystal substrate at least in correspondence to said mutually contacting first and second principal surfaces;

removing said second substrate and at least one of said plurality of epitaxial layers formed between said second substrate and said etching stopping layer by a first etching process; and removing said etching stopping layer by a second etching process.

2. The method as claimed in claim 1, further comprising a step of reducing a thickness of said single crystal layer to a predetermined thickness after said step of removing said etching stopping layer.

3. The method as claimed in claim 2, wherein said step of reducing the thickness of said single crystal layer comprises the steps of:

mechanically lapping an exposed third principal surface of said single crystal layer opposite said first principal surface; and chemically etching said exposed third principal surface.

4. The method as claimed in claim 1, wherein said single crystal layer is formed to have a thickness less than one-third of a thickness of said single crystal substrate, prior to said step of bonding.

5. The method as claimed in claim 4 wherein said single crystal layer has a thickness of at most 200 μm.

6. The method as claimed in claim 1, wherein said first compound semiconductor material essentially consists of GaAs.

7. The method as claimed in claim 1, wherein said first compound semiconductor material essentially consists of InP.

8. The method as claimed in claim 1, wherein said plurality of epitaxial layers comprise an AlGaAs layer and a GaAs layer.

9. The method as claimed in claim 1, wherein said plurality of epitaxial layers comprise an InGaP layer and a GaAs layer.

10. The method as claimed in claim 1, wherein said plurality of epitaxial layers comprise a GaAs layer, an AlGaAS layer and an InGaP layer.

11. The method as claimed in claim 1, wherein said plurality of epitaxial layers comprise an InP layer, an InGaAs layer, and an InAlAs layer.

12. The method as claimed in claim 1, wherein said step of bonding is conducted by elevating the temperature to a range between 500° C. and 700° C.

13. The method as claimed in claim 12, wherein said step of bonding is conducted by elevating the temperature to about 650° C.

14. The method as claimed in claim 1, further comprising the step of applying a partial pressure of an element that constitutes the first compound semiconductor material at a level approximately equal to a partial equilibrium pressure of said element in said first compound semiconductor material during said step of bonding.

15. The method as claimed in claim 14, wherein the first compound semiconductor material contains arsenic, and said step of applying a partial pressure further comprises supplying an arsenic vapor with a partial pressure equivalent to the partial pressure of arsenic in said first compound semiconductor material.

16. The method as claimed in claim 1, further comprising the step of elevating the temperature up to 1100° C., during said step of bonding.

17. The method as claimed in claim 1, further comprising the step of applying a pressure on said single crystal layer and said single crystal substrate such that said first and second principal surfaces are urged toward each other for intimate contact, during said step of bonding.

18. The method as claimed in claim 17, wherein said step of applying a pressure further comprises applying a d.c. voltage pulse across said single crystal substrate and said single crystal layer.

19. The method as claimed in claim 1, wherein said first and second compound semiconductor materials are the same material.

* * * * *